(12) United States Patent
Wickman et al.

(10) Patent No.: US 11,113,435 B2
(45) Date of Patent: *Sep. 7, 2021

(54) EVALUATION OF A SIMULATED VEHICLE FUNCTIONALITY FEATURE

(71) Applicant: Volvo Car Corporation, Gothenburg (SE)

(72) Inventors: Casper Wickman, Öckerö (SE); Mattias Wikenmalm, Torslanda (SE); Timotei Ghiurau, Gothenburg (SE); Jon Seneger, Boulder Creek, CA (US)

(73) Assignee: Volvo Car Corporation, Gothenburg (SE)

( * ) Notice: Subject to any disclaimer, the term of this patent is extended or adjusted under 35 U.S.C. 154(b) by 0 days.

This patent is subject to a terminal disclaimer.

(21) Appl. No.: 16/672,695

(22) Filed: Nov. 4, 2019

(65) Prior Publication Data

US 2020/0184030 A1 Jun. 11, 2020

(30) Foreign Application Priority Data

Dec. 7, 2018 (EP) .................................. 18210997

(51) Int. Cl.
*G02B 27/00* (2006.01)
*G06F 30/20* (2020.01)
(Continued)

(52) U.S. Cl.
CPC ......... *G06F 30/20* (2020.01); *G02B 27/0093* (2013.01); *G06F 3/14* (2013.01); *B60K 37/02* (2013.01)

(58) Field of Classification Search
CPC ....... G06F 30/20; G06F 3/14; G02B 27/0093; B60K 37/02
See application file for complete search history.

(56) References Cited

U.S. PATENT DOCUMENTS

2019/0188912 A1* 6/2019 Kamini ................ G05D 1/0088

OTHER PUBLICATIONS

May 23, 2019 European Search Report issued on international Application No. 18210997.
(Continued)

*Primary Examiner* — Chong Wu
(74) *Attorney, Agent, or Firm* — Clements Bernard Walker; Christopher L. Bernard (57) ABSTRACT

A method performed by a vehicle feature evaluation system (1) for enabling evaluation of a simulated vehicle functionality feature. The vehicle feature evaluation system determines (1001) in relation to a road-driven vehicle (2), with support from a tracking system (5), an orientation of a head-mounted display (4), HMD, adapted to be worn by an occupant (3) on-board the road-driven vehicle. The vehicle feature evaluation system further determines (1002) a simulated vehicle functionality feature to be evaluated in the road-driven vehicle. Moreover, the vehicle feature evaluation system provides (1004) in real-time to a HMD display (42) of the HMD, taking into consideration the HMD orientation, a virtual representation (7) of the simulated vehicle functionality feature superimposed on a real-time real-world video stream (6) derived from real-world image data captured with support from one or more forward-facing cameras (41) provided on the HMD in eye-position of the occupant.

13 Claims, 4 Drawing Sheets (51) Int. Cl.
    *G06F 3/14*      (2006.01)
    *B60K 37/02*     (2006.01)

(56) References Cited

OTHER PUBLICATIONS

Frund J. et al, "Cooperative design support within automobile advance development using augmented reality technology", Computer Supported Cooperative Work In Design, 2004.
Hobson, "MINI'S augmented-reality glasses can make cars transparent" Apr. 24, 2015, pp. 1-10.
Toshikazu Ohshima et al., "A Mixed Reality System with Visual and Tangible Interaction Capability—Application to Evaluating Automobile Interior Design",The second IEEE and ACM international symposium on mixed and augmented reality, Oct. 7, 2003, IEEE Computer Society.
Purschke F et al., "Virtual reality—new Methods for Improving and Accelerating the Development Process in Vehicle Styling and Design", Computer Graphics International, 1998. Jun. 22, 1998, pp. 789-797.

\* cited by examiner

EVALUATION OF A SIMULATED VEHICLE FUNCTIONALITY FEATURE

CROSS-REFERENCE TO RELATED APPLICATION

The present disclosure claims the benefit of priority of co-pending European Patent Application No. 18210997.5, filed on Dec. 7, 2018, and entitled "EVALUATION OF A SIMULATED VEHICLE FUNCTIONALITY FEATURE," the contents of which are incorporated in full by reference herein.

TECHNICAL FIELD

The present disclosure relates to enabling evaluation of a simulated vehicle functionality feature.

BACKGROUND

In the automotive field, when evaluating new vehicle functions, interaction designs, interaction models and/or new product designs, it is known to provide a virtually modelled evaluation environment. Static or dynamic evaluation rigs are commonly utilized, where the static rig for instance may be represented by a non-movable rig that may display the environment and traffic on large scale screens in front of a vehicle mock-up, and where the dynamic rig for instance may be represented by a similar rig with the difference that the dynamic rig may move in order to simulate acceleration forces and/or movement.

A drawback for both static and dynamic rigs is that the test subject may feel motion sickness. Yet another drawback is that the environment as well as the traffic in fact is simulated. The latter results in that the interaction therewith may become somewhat artificial, and it may be difficult to validate that the result actually corresponds to an experience in a real vehicle, in real traffic.

An alternative would be to implement new concepts in a real vehicle—i.e. in a road-driven vehicle—and use said vehicle for evaluations. This approach, however, is very time consuming and expensive, and would further limit the number of different concepts that can be evaluated.

Accordingly, there is room for improvement and/or for alternative solutions when it comes to evaluating new vehicle functions and/or concepts.

SUMMARY

It is therefore an object of embodiments herein to provide an improved and/or alternative approach supporting evaluation of virtual vehicle functions and/or concepts.

According to a first aspect of embodiments herein, the object is achieved by a method performed by a vehicle feature evaluation system for enabling evaluation of a simulated vehicle functionality feature. The vehicle feature evaluation system determines in relation to a road-driven vehicle, with support from a tracking system, an orientation of a head-mounted display, HMD, adapted to be worn by an occupant on-board the road-driven vehicle. The vehicle feature evaluation system further determines a simulated vehicle functionality feature to be evaluated in the road-driven vehicle. Moreover, the vehicle feature evaluation system provides in real-time to a HMD display of the HMD, taking into consideration the HMD orientation, a virtual representation of the simulated vehicle functionality feature superimposed on a real-time real-world video stream derived from real-world image data captured with support from one or more forward-facing cameras provided on the HMD in eye-position of the occupant.

Thereby, there is introduced an approach which enables a virtual version of a vehicle functionality feature to be evaluated without actual vehicle implementation of said feature. Thereby, a costly and time consuming real implementation evaluation may be avoided. That is, since there is determined in relation to a road-driven vehicle, with support from a tracking system, an orientation of a head mounted display, HMD, adapted to be worn by an occupant on-board the road-driven vehicle, there is established a position and/or location of an occupant-worn HMD in view of a real vehicle e.g. adapted to and/or intended to be driven outdoors such as in real traffic and/or along actual roads. Thus, with the HMD-wearing occupant being positioned in a road-driven vehicle rather than in an e.g. indoor static or dynamic rig, evaluation of the simulated vehicle functionality feature may take place in an actual real vehicle. Furthermore, that is, since there is determined a simulated vehicle functionality feature to be evaluated in the road-driven vehicle, there is defined, e.g. computer-generated, a virtual vehicle functionality feature of interest to validate in a real vehicle. Moreover, that is, since there is provided in real-time to a HMD display of the HMD, taking into consideration the HMD orientation, a virtual representation of the simulated vehicle functionality feature superimposed on a real-time real-world video stream derived from real-world image data captured with support from one or more forward-facing cameras provided on the HMD in eye-position of the occupant, there is provided to the HMD display a real-time physical world view—essentially as seen by the occupant with support from the eye-level forward facing camera(s)—electronically mixed with the computer-generated virtual representation temporally and spatially commensurate with said physical world view such that the real-world video stream appears as a background overlaid with said virtual representation. Subsequently, with the HMD-wearing occupant being on-board the road-driven vehicle, e.g. seated in a driver's seat or passenger's seat thereof, the real-time real-world video stream may then represent what a driver or passenger of said road-driven vehicle would see even if not wearing the HMD, such as for instance a portion of an interior of the vehicle and/or a view exterior of the vehicle through the windscreen or other window(s) thereof. Accordingly, upon in real-time superimposing a virtual representation of a simulated vehicle functionality feature—such as for instance a virtual display with e.g. new and/or updated design and/or functionality—on the real-world video stream, said simulated vehicle functionality feature may be evaluated in a road-driven vehicle, e.g. while said road-driven vehicle is driven in real traffic and/or along actual roads. Thereby, with the exception of the virtual representation of the simulated vehicle functionality feature, the entire test environment is authentic and/or real. Consequently, the simulated vehicle functionality feature may be evaluated in real traffic and/or in real road-driving scenarios, which thus enables said simulated vehicle functionality feature to be evaluated under more reality-resembling conditions and/or in a more reality-resembling environment than should said evaluation be performed in e.g. a commonly known static or dynamic rig displaying the environment and traffic on large scale screens in front of a vehicle mock-up.

For that reason, an improved and/or alternative approach is provided supporting evaluation of virtual vehicle functions and/or concepts.

The technical features and corresponding advantages of the above mentioned method will be discussed in further detail in the following.

By introducing a method performed by a vehicle feature evaluation system for enabling evaluation of a simulated vehicle functionality feature, an approach is provided which enables a virtual version of a vehicle functionality feature to be evaluated without actual vehicle implementation of said feature. Thereby, a costly and time consuming real implementation evaluation may be avoided. The expression "vehicle feature evaluation system" may refer to "vehicle feature validation system", "vehicle evaluation system", "evaluation system" and/or "evaluation supporting system", whereas "for enabling evaluation of" may refer to "for evaluating" and/or "for providing". Furthermore, "enabling" evaluation may refer to "supporting" evaluation, whereas "evaluation" may refer to "validation", "testing" and/or "analysis". "Simulated" vehicle functionality feature, on the other hand, may refer to "virtual", "computer-generated", "modelled" and/or "fictive" vehicle functionality feature, whereas "a simulated vehicle functionality feature" may refer to "a simulated vehicle function", "a simulated vehicle functionality", "a simulated vehicle feature" and/or "simulated vehicle characteristics". According to an example, the expression "for enabling evaluation of a simulated vehicle functionality feature" may refer to "for enabling evaluation of a simulated vehicle functionality feature in a road-driven vehicle".

Since the vehicle feature evaluation system determines in relation to a road-driven vehicle, with support from a tracking system, an orientation of a head mounted display, HMD, adapted to be worn by an occupant on-board the road-driven vehicle, there is established a position and/or location of an occupant-worn HMD in view of a real vehicle e.g. adapted to and/or intended to be driven outdoors such as in real traffic and/or along actual roads. Thus, according to the introduced inventive concept and as will be described in further detail further on, with the HMD-wearing occupant—which may also be referred to as the test subject—being positioned in a road-driven vehicle rather than in an e.g. indoor static or dynamic rig, evaluation may take place in an actual real vehicle. Determining the orientation of the HMD in relation to the road-driven vehicle, with support from the tracking system, may be accomplished as commonly known in the art, for instance with input from tracking sensors such as cameras, accelerometers, magnetometers and/or gyroscopes, and/or based on software tracking e.g. aligning markers in the vehicle with corresponding markers in the virtual model. The HMD, on the other hand, may comprise and/or support any arbitrary features known in the art from HMDs commonly utilized today, with the addition of further features that will be described further on. The referred to "vehicle" may be represented by any arbitrary vehicle, for instance an engine-propelled vehicle, such as e.g. a car, truck, lorry, van, tractor and/or bus. The expression "road-driven vehicle", on the other hand, may refer to "real vehicle", "outdoor vehicle", "vehicle adapted to be driven in real traffic" and/or "vehicle adapted to be driven along outdoor tracks and/or public roads and/or public road networks". "Determining" in relation to a road-driven vehicle may refer to "calculating and/or analysing" in relation to a road-driven vehicle and/or "determining optically, magnetically and/or by means of laser and/or by means of software" in relation to a road-driven vehicle. "In relation to" may refer to "in view of" and/or "in comparison to". "In relation to a road-driven vehicle" may further refer to "in relation to a reference point of a road-driven vehicle", which "reference point" may be arbitrarily selected as deemed adequate for the implementation at hand. The expression "with support from" a tracking system may refer to "by means of" a tracking system and/or "with input from" a tracking system, whereas "a tracking system", on the other hand, may refer to "one or more tracking sensors" and/or "a software based tracking system". "An orientation" of a head-mounted display may refer to "a position and/or location of" a head-mounted display, whereas "head-mounted display" may refer to "augmented reality and/or virtual reality head-mounted display", "goggles" and/or "electronic goggles". The expression "adapted to be worn by" an occupant may refer to "adapted to be worn at least partly in front of the eyes of" an occupant and/or merely "worn by" an occupant, whereas "an occupant" may refer to "a vehicle occupant", "a driver" and/or "a test subject". "On-board" the road-driven vehicle may refer to "positioned in", "seated in a front seat of" and/or "seated in a driver's seat of" the road-driven vehicle.

Since the vehicle feature evaluation system determines a simulated vehicle functionality feature to be evaluated in the road-driven vehicle, there is defined—e.g. computer-generated—a virtual vehicle functionality feature of interest to validate in a real vehicle. "Determining" a simulated vehicle functionality feature may refer to "computer-generating", "simulating" and/or "modelling" a simulated vehicle functionality feature, whereas vehicle "functionality feature" may refer to vehicle "characteristics" and further to merely vehicle "feature" and/or vehicle "functionality". According to an example, "determining" a simulated vehicle functionality feature may refer to "determining logic, design, graphics, aesthetics, geometries and/or functionality of" a simulated vehicle functionality feature.

Since the vehicle feature evaluation system provides in real-time to a HMD display of the HMD, taking into consideration the HMD orientation, a virtual representation of the simulated vehicle functionality feature superimposed on a real-time real-world video stream derived from real-world image data captured with support from one or more forward-facing cameras provided on the HMD in eye-position of the occupant, there is provided to the HMD display a real-time physical world view—essentially as seen by the occupant with support from the eye-level forward facing camera(s)—electronically mixed with the computer-generated virtual representation temporally and spatially commensurate with said physical world view such that the real-world video stream appears as a background overlaid with said virtual representation. Thus, live imagery from the physical world is electronically merged with computer-generated imagery, a concept commonly referred to as mixed reality and/or augmented reality. More specifically, the virtual representation of the simulated vehicle functionality feature is overlaid the real-world video stream, a concept commonly referred to as video see-through. The camera(s) and/or HMD may for instance be adapted to support arranging and/or re-arranging said camera(s) such that the camera(s) are positioned to correspond to respective points of right and left eye views of the occupant. Thus, with the forward-facing camera(s) provided in eye-position of the HMD-wearing occupant, the real-time real-world video stream may represent what the occupant would see even if not wearing the HMD, such as temporally and spatially commensurate with what said occupant would see even if not wearing the HMD. Subsequently, with the HMD-wearing occupant being on-board the road-driven vehicle, e.g. seated in a driver's seat or passenger's seat thereof, the real-time real-world video stream may then represent what a driver or passenger of said road-driven vehicle would see even if not wearing the HMD, such as for instance a portion of an interior of the vehicle and/or a view exterior of the vehicle through the windscreen or other window(s) thereof. Accordingly, upon in real-time superimposing a virtual representation of a simulated vehicle functionality feature—such as for instance a virtual display with e.g. new and/or updated design and/or functionality—on the real-world video stream, said simulated vehicle functionality feature may be evaluated in a road-driven vehicle, e.g. while said road-driven vehicle is driven in real traffic and/or along actual roads. Thereby, with the exception of the virtual representation of the simulated vehicle functionality feature, the entire test environment is authentic and/or real. Consequently, the simulated vehicle functionality feature may be evaluated in real traffic and/or in real road-driving scenarios, which thus enables said simulated vehicle functionality feature to be evaluated under more reality-resembling conditions and/or in a more reality-resembling environment than should said evaluation be performed in e.g. a commonly known static or dynamic rig displaying the environment and traffic on large scale screens in front of a vehicle mock-up.

"Providing" to a HMD display may refer to "providing wirelessly", "rendering" and/or "transmitting" to a HMD display and/or "generating, processing, rendering and/or producing, and providing" to a HMD display, whereas "HMD display" may refer to "one or more HMD displays". Providing "in real-time", on the other hand, may refer to providing "essentially in real-time" and/or "live", and further to that the virtual representation superimposed on the real-world video stream is provided to the HMD display substantially close to the time of the actual capturing of the real-world image data. According to an example, "providing in real-time" may refer to merely "providing". The expression "taking into consideration" the HMD orientation may refer to "considering" and/or "taking into consideration for positioning and/or spatial positioning" the HMD orientation. "Virtual" representation, on the other hand, may refer to "augmented" and/or "overlaid" representation, whereas "representation" may refer to "augmentation", "data" and/or "geometrical and/or graphical model". According to an example, "representation" may further refer to "graphical model", "computer-aided design, CAD, geometrics and/or design surface model, DSM, geometrics" and/or "result from computer-aided engineering, CAE". "Superimposed on" a real-time real-world video stream, on the other hand, may refer to "overlaid", "virtually overlaid", "placed and/or displayed in front of" a real-time real-world video stream, whereas "a real-time" real-world video stream may refer to "an essentially real-time", "a live or essentially live" and/or "instant or essentially instant" real-world video stream. The term "real-time" real-world video stream may further indicate that the real-world video stream is derived in a timeframe substantially close to the time of the actual capturing of the real-world image data. "Real-world", on the other hand, may refer to "physical world" and/or "real environment world", whereas "video stream" may refer to "streaming video" and/or merely "video". "Derived from" real-world image data may refer to "which video stream is based on" real-world image data, whereas "real-world image data" may refer to "video data" and/or "images". "Captured" with support from one or more forward-facing cameras, on the other hand, may refer to "taped" and/or "filmed" with support from one or more forward-facing cameras, whereas captured "with support from" one or more forward-facing cameras may refer to captured "by" and/or "by means of" one or more forward-facing cameras. Furthermore, "one or more" forward-facing cameras may refer to "at least two" forward-facing cameras, whereas "forward-facing" cameras may refer to "essentially forward-facing" cameras. "Provided on" the HMD may refer to "comprised in", "mounted on" and/or "attached to" the HMD, whereas provided on the HMD "in eye-position" of the occupant may refer to provided on the HMD "positioned to correspond to respective points of right and left eye views" of the occupant. Accordingly, to an example, the expression "captured with support from one or more forward-facing cameras provided on the HMD in eye-position of the occupant" may refer to "captured with support from at least two forward-facing cameras respectively positioned to correspond to respective points of right and left eye views of the occupant".

Optionally, the simulated vehicle functionality feature may comprise a simulated vehicle human machine interface, HMI. Thereby, a virtual vehicle HMI may be evaluated in the road-driven vehicle, such as e.g. graphics thereof and/or new and/or updated functionality and/or design thereof. The expression that the simulated vehicle functionality feature "comprises" may refer to that the simulated vehicle functionality feature "is represented by". Additionally or alternatively, optionally, the simulated vehicle functionality feature may comprise a simulated vehicle display. Thereby, a virtual vehicle display e.g. an infotainment display may be evaluated in the road-driven vehicle, such as e.g. graphics thereof and/or new and/or updated functionality and/or design thereof. Moreover, additionally or alternatively, optionally, the simulated vehicle functionality feature may comprise a simulated vehicle head-up display, HUD. Thereby, a virtual vehicle HUD may be evaluated in the road-driven vehicle, such as e.g. graphics thereof and/or new and/or updated functionality and/or design thereof. Additionally or alternatively, optionally, the simulated vehicle functionality feature may comprise a simulated interior vehicle section. Thereby, a virtual interior vehicle section e.g. a dashboard or a portion thereof may be evaluated in the road-driven vehicle, such as e.g. geometrics for instance CAD and/or DSM geometrics thereof and/or new and/or updated colour(s), material(s) and/or design thereof. Furthermore, additionally or alternatively, optionally, the simulated vehicle functionality feature may comprise simulated light characteristics. Thereby, virtual light characteristics e.g. interior light characteristics may be evaluated in the road-driven vehicle, such as e.g. new and/or updated appearance and/or ambience of e.g. interior lighting. The expression light "characteristics" may refer to light "position(s)", "positioning", "function(s)", "ambience" and/or "appearance". Additionally or alternatively, optionally, the simulated vehicle functionality feature may comprise a simulated effect resulting from a simulation of the simulated vehicle functionality feature. Thereby, a virtual effect resulting from simulation of a simulated vehicle functionality feature e.g. wiper performance, cabin climate, air flow, contamination etc. may be evaluated in the road-driven vehicle, such as e.g. the effect of a computer-aided engineering, CAE, simulation thereof.

Optionally, the vehicle feature evaluation system may determine a fictive location of the simulated vehicle functionality feature relative the road-driven vehicle. The above discussed providing of the virtual representation taking into consideration the HMD orientation may then comprise providing the virtual representation superimposed on the real-time real-world video stream such that positioning of the virtual representation corresponds to the fictive location. Thereby, it is provided that the positioning of the overlaid virtual representation on the real-world video stream spatially commensurate with the intended fictive vehicle location of the vehicle functionality feature to be simulated. The fictive location may be arbitrarily selected as deemed relevant for the implementation at hand, and may further be of any arbitrary form, size and/or dimensions ranging from a few millimetres up to hundreds or even thousands of millimetres across. "Determining" a fictive location may refer to "mapping" a fictive location, whereas "fictive" location may refer to "intended" and/or "virtual" location. Fictive "location", on the other hand, may refer to fictive "position" and/or "placement", whereas "relative" the road-driven vehicle may refer to "in relation to" and/or "within" the road-driven vehicle. "Corresponds to" the fictive location may refer to "commensurate with", "reflects" and/or "represents" the fictive location.

Optionally, the vehicle feature evaluation system may further comprise updating the virtual representation based on a user interaction with the simulated vehicle functionality feature. Thereby, interaction by a user with the simulated vehicle functionality feature—e.g. by a user voice command—may result in that the virtual representation of the simulated vehicle functionality feature is updated in accordance with said interaction. That is, user interaction with the simulated vehicle functionality feature, which feature for instance is represented by selectable options available on a simulated vehicle display, may result in that a user selected option is carried out and/or updated in accordance with the user interaction, which subsequently is reflected by the corresponding virtual feature being updated in accordance therewith. User interaction may be detected in any arbitrary manner known in the art, e.g. by means of one or more user interaction sensors and/or a user interaction determining system, for instance comprising a microphone. The expression "updating" the virtual representation may refer to "updating content, graphical data and/or geometric data of" the virtual representation, whereas "based on a" user interaction may refer to "as a result of" user interaction and/or "based on input data and/or one or more signals derived from" user interaction. "User interaction", on the other hand, may refer to "occupant interaction".

Optionally, said user interaction may be based on detection, by means of one or more user interaction sensors, of a user in and/or at the fictive location. Thereby, presence of a user, e.g. the HMD-wearing occupant, and/or e.g. a finger of said user/occupant, may be sensed in or at the position in the vehicle representing the location of the simulated vehicle functionality feature, whereby the virtual representation of the simulated vehicle functionality feature subsequently may be updated in accordance with said presence, and/or in accordance with the geographical position and/or the nature of said presence. User interaction may be detected in any arbitrary manner known in the art, e.g. by means of one or more user interaction sensors and/or a user interaction determining system, for instance comprising touch sensor(s), camera(s) and/or position detection sensor(s) worn by the user e.g. on his/her hand and/or finger. The expression detection "by means of" one or more user interaction sensors may refer to detection "with support from" and/or "with input from" one or more user interaction sensors. Detection "of a user", on the other hand, may refer to detection "of the occupant", and further to detection "of a hand and/or one or more fingers of a user". The expression "in and/or at" the fictive location may refer to "in or at a location within the vehicle representing" the fictive location.

Optionally, the vehicle feature evaluation system may further comprise updating the virtual representation based on a vehicle signal affecting the simulated vehicle functionality feature, derived from the road-driven vehicle. Thereby, deriving a vehicle signal which affects the simulated vehicle functionality feature—e.g. resulting from manoeuvring of and/or user interaction with the road-driven vehicle—results in that the virtual representation of the simulated vehicle functionality feature is updated in accordance therewith. That is, deriving—from the road-driven vehicle—a vehicle signal affecting the simulated vehicle functionality feature, where the vehicle signal for instance comprises vehicle data such as e.g. fuel consumption and where the simulated vehicle functionality feature for instance is represented by a simulated vehicle display showing said vehicle data e.g. fuel consumption, may result in that the virtual feature—in this example the virtual vehicle display—is updated in accordance with said vehicle signal, i.e. the fuel consumption value shown on the virtual display is updated along with the received vehicle signal comprising an updated fuel consumption value. The vehicle signal may be derived from the road-driven vehicle in any arbitrary known manner, for instance via wired and/or wireless communication therewith, and/or with support from a vehicle signal determining system and/or unit adapted for determining which input derived from the road-driven vehicle affects the simulated vehicle functionality feature. The expression "updating" the virtual representation may refer to "updating content, graphical data and/or geometric data of" the virtual representation, whereas "based on a" vehicle signal may refer to "based on input and/or data from a" vehicle signal. "Derived from" the road-driven vehicle, on the other hand, may refer to "received from" the road-driven vehicle. According to an example, "updating the virtual representation based on a vehicle signal affecting the simulated vehicle functionality feature, derived from the road-driven vehicle" may refer to "updating the virtual representation based on a vehicle signal derived from the road-driven vehicle, which vehicle signal is based on a manoeuvring of and/or user interaction with the road-driven vehicle affecting the simulated vehicle functionality feature".

Optionally, the vehicle feature evaluation system may update the real-time video stream and/or the superimposed virtual representation based on updated captured image data and/or based on updated determined HMD orientation. Thereby, it is provided that the real-time video stream and/or the virtual representation is continuously updated to reflect updated captured image data and/or updated orientation of the HMD. "Updating" may refer to "continuously and/or intermittently updating".

According to a second aspect of embodiments herein, the object is achieved by a vehicle feature evaluation system for—and/or adapted for—enabling evaluation of a simulated vehicle functionality feature. The vehicle feature evaluation system comprises a HMD orientation determining unit for—and/or adapted for—determining in relation to a road-driven vehicle, with support from a tracking system, an orientation of a head-mounted display, HMD, adapted to be worn by an occupant on-board the road-driven vehicle. The vehicle feature evaluation system further comprises a feature determining unit for—and/or adapted for—determining a simulated vehicle functionality feature to be evaluated in the road-driven vehicle. Moreover, the vehicle feature evaluation system comprises a HMD providing unit for—and/or adapted for—providing in real-time to a HMD display of the HMD, taking into consideration the HMD orientation, a virtual representation of the simulated vehicle functionality feature superimposed on a real-time real-world video stream derived from real-world image data captured with support from one or more forward-facing cameras provided on the HMD in eye-position of the occupant.

Optionally, the simulated vehicle functionality feature may comprise a simulated vehicle human machine interface, HMI. Additionally or alternatively, optionally, the simulated vehicle functionality feature may comprise a simulated vehicle display. Moreover, additionally or alternatively, optionally, the simulated vehicle functionality feature may comprise a simulated vehicle head-up display, HUD. Additionally or alternatively, optionally, the simulated vehicle functionality feature may comprise a simulated interior vehicle section. Furthermore, additionally or alternatively, optionally, the simulated vehicle functionality feature may comprise simulated light characteristics. Additionally or alternatively, optionally, the simulated vehicle functionality feature may comprise a simulated effect resulting from a simulation of the simulated vehicle functionality feature.

Optionally, the vehicle feature evaluation system may further comprise a location determining unit for—and/or adapted for—determining a fictive location of the simulated vehicle functionality feature relative the road-driven vehicle. The HMD providing unit may then be further adapted for providing the virtual representation superimposed on the real-time real-world video stream such that positioning of the virtual representation corresponds to the fictive location.

Optionally, the vehicle feature evaluation system may further comprise a user interaction updating unit for—and/or adapted for—updating the virtual representation based on a user interaction with the simulated vehicle functionality feature. Moreover, optionally, the user interaction may be based on detection, by means of one or more user interaction sensors, of a user in and/or at the fictive location.

Optionally, the vehicle feature evaluation system may further comprise a vehicle signal updating unit for—and/or adapted for—updating the virtual representation based on a vehicle signal affecting the simulated vehicle functionality feature, derived from the road-driven vehicle.

Optionally, the vehicle feature evaluation system may further comprise a continuous updating unit for—and/or adapted for—updating the real-time video stream and/or the superimposed virtual representation based on updated captured image data and/or based on updated determined HMD orientation.

Similar advantages as those mentioned in the foregoing in relation to the first aspect correspondingly apply to the second aspect, which is why these advantages are not further discussed.

According to a third aspect of embodiments herein, the object is achieved by a vehicle—e.g. a road-driven vehicle—comprising a vehicle feature evaluation system as discussed above. Again, similar advantages as those mentioned in the foregoing in relation to the first aspect correspondingly apply to the third aspect, which is why these advantages are not further discussed.

According to a fourth aspect of embodiments herein, the object is achieved by a computer program product comprising a computer program containing computer program code means arranged to cause a computer or a processor to execute the steps of the vehicle feature evaluation system discussed in the foregoing, stored on a computer-readable medium or a carrier wave. Yet again, similar advantages as those mentioned in the foregoing in relation to the first aspect correspondingly apply to the fourth aspect, which is why these advantages are not further discussed.

BRIEF DESCRIPTION OF THE DRAWINGS

The various aspects of the non-limiting embodiments, including particular features and advantages, will be readily understood from the following detailed description and the accompanying drawings, in which.

DETAILED DESCRIPTION

Non-limiting embodiments of the present disclosure will now be described more fully hereinafter with reference to the accompanying drawings, in which currently preferred embodiments of the disclosure are shown. This disclosure may, however, be embodied in many different forms and should not be construed as limited to the embodiments set forth herein. Like reference characters refer to like elements throughout. Dashed lines of some boxes in the figures indicate that these units or actions are optional and not mandatory.

In the following, according to embodiments herein which relate to enabling evaluation of a simulated vehicle functionality feature, there will be disclosed an approach which enables a virtual version of a vehicle functionality feature to be evaluated without actual vehicle implementation of said feature.

Figure 1:
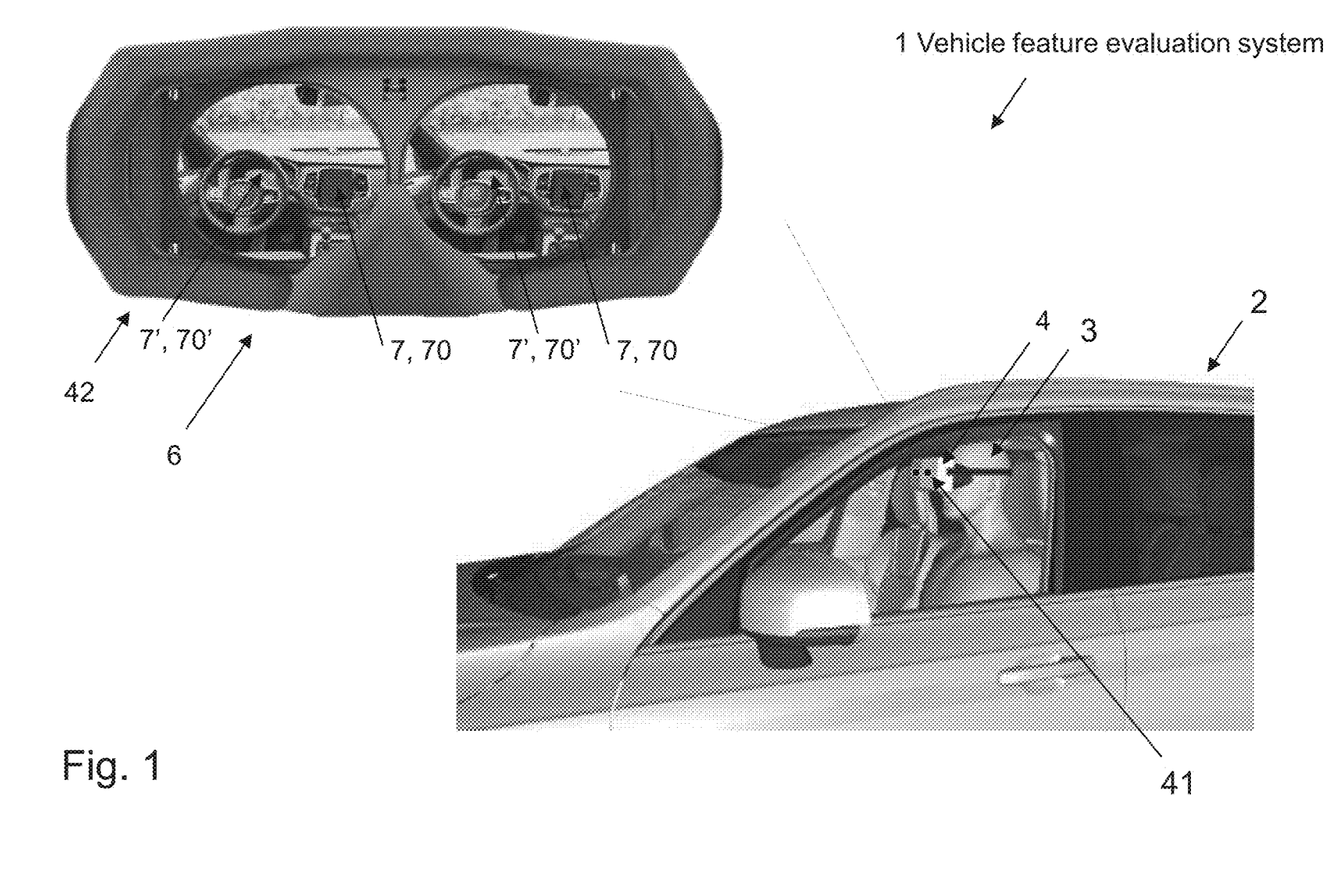
FIG. 1 illustrates a schematic view of an exemplifying vehicle feature evaluation system according to embodiments of the disclosure.
Figure 2:
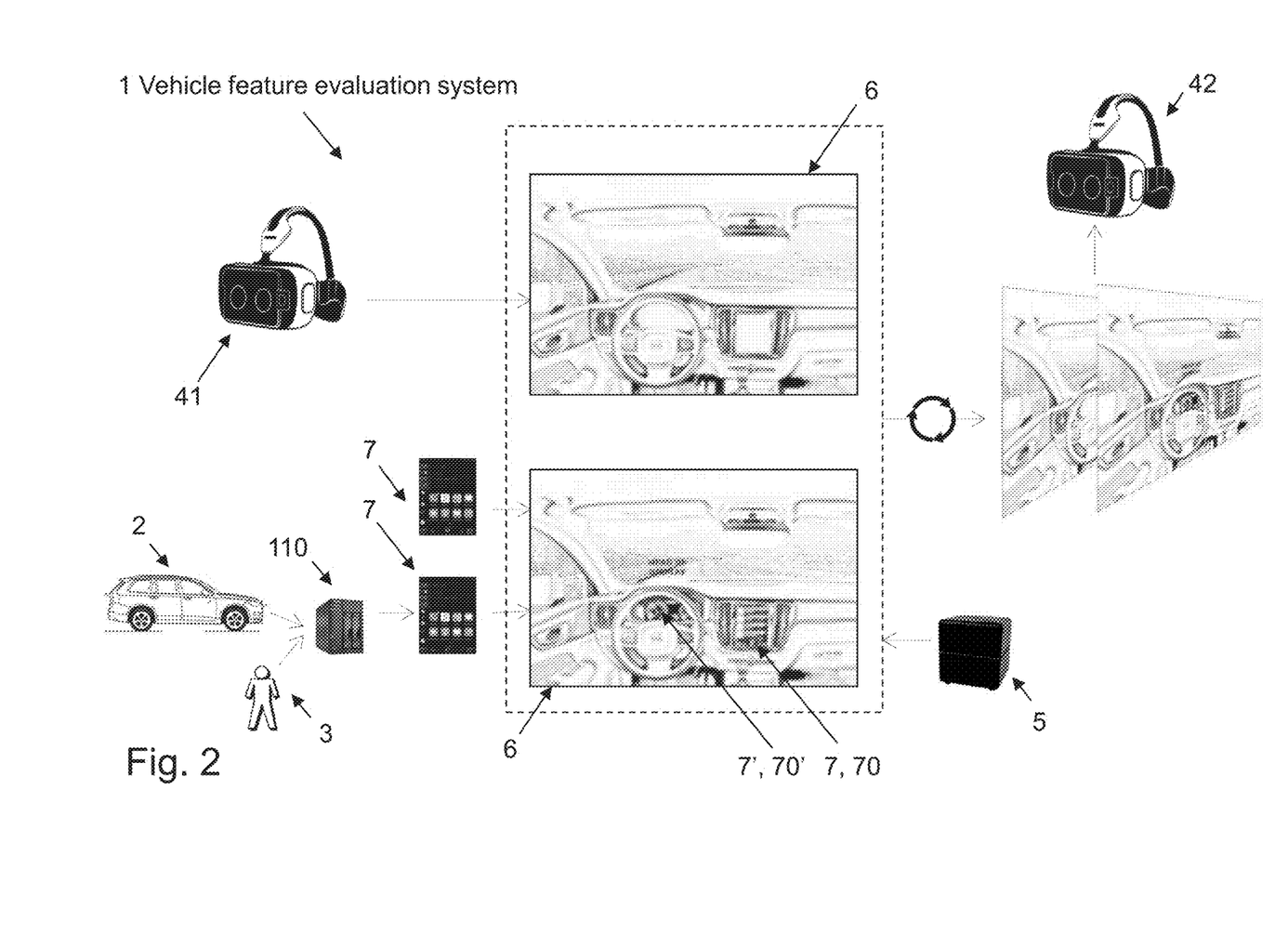
FIG. 2 illustrates a schematic view of the vehicle feature evaluation system of FIG. 1 in greater detail.

Referring now to the figures and FIGS. 1-2 in particular, there is depicted a schematic view of an exemplifying vehicle feature evaluation system 1 according to embodiments of the disclosure. The vehicle feature evaluation system 1 is here comprised in a road-driven vehicle 2, namely an exemplifying a passenger car. On-board said vehicle 2 is an occupant 3, wearing an HMD 4, the orientation of which—in relation to the vehicle 2—may be determined with support from a tracking system 5 (shown in FIG. 2). Provided on said HMD 4 is one or more forward-facing cameras 41, here two cameras, in eye-position of the occupant 3. The HMD 4 further comprises at least one HMD display 42, here two displays, on which it is displayed a real-time real-world video stream 6 derived from real-world image data captured with support from the one or more forward-facing cameras 41. Superimposed on said video stream 6 is a virtual representation 7 of a simulated vehicle functionality feature to be evaluated in the road-driven vehicle 2. The simulated vehicle functionality feature here comprises an exemplifying simulated vehicle display, more specifically a simulated infotainment display, and the virtual representation 7 is accordingly here represented by a virtual infotainment display. The simulated vehicle functionality feature may have a fictive location 70 relative the vehicle 2, and for the exemplifying simulated infotainment display in FIGS. 1-2, the fictive location 70 is essentially centered on a dashboard of the vehicle 2 in an exemplifying manner. Additionally depicted is an exemplifying alternative virtual representation 7' of an alternative simulated vehicle functionality feature. The alternative simulated vehicle functionality feature here comprises an optional exemplifying simulated driver information display, and the alternative virtual representation 7' is then accordingly represented by an exemplifying virtual driver information display. The simulated driver information display here has an exemplifying fictive location 70' on the vehicle dashboard, behind a steering wheel of the road-driven vehicle 2. According to other embodiments, a simulated vehicle functionality feature may additionally or alternatively optionally comprise a simulated vehicle HMI, a simulated HUD, a simulated interior vehicle section, simulated light characteristics and/or a simulated effect resulting from a simulation of the simulated vehicle functionality feature. Additionally shown in FIG. 2 is an optional server 110, which will be described in greater detail in conjunction with FIG. 3.

Figure 3:
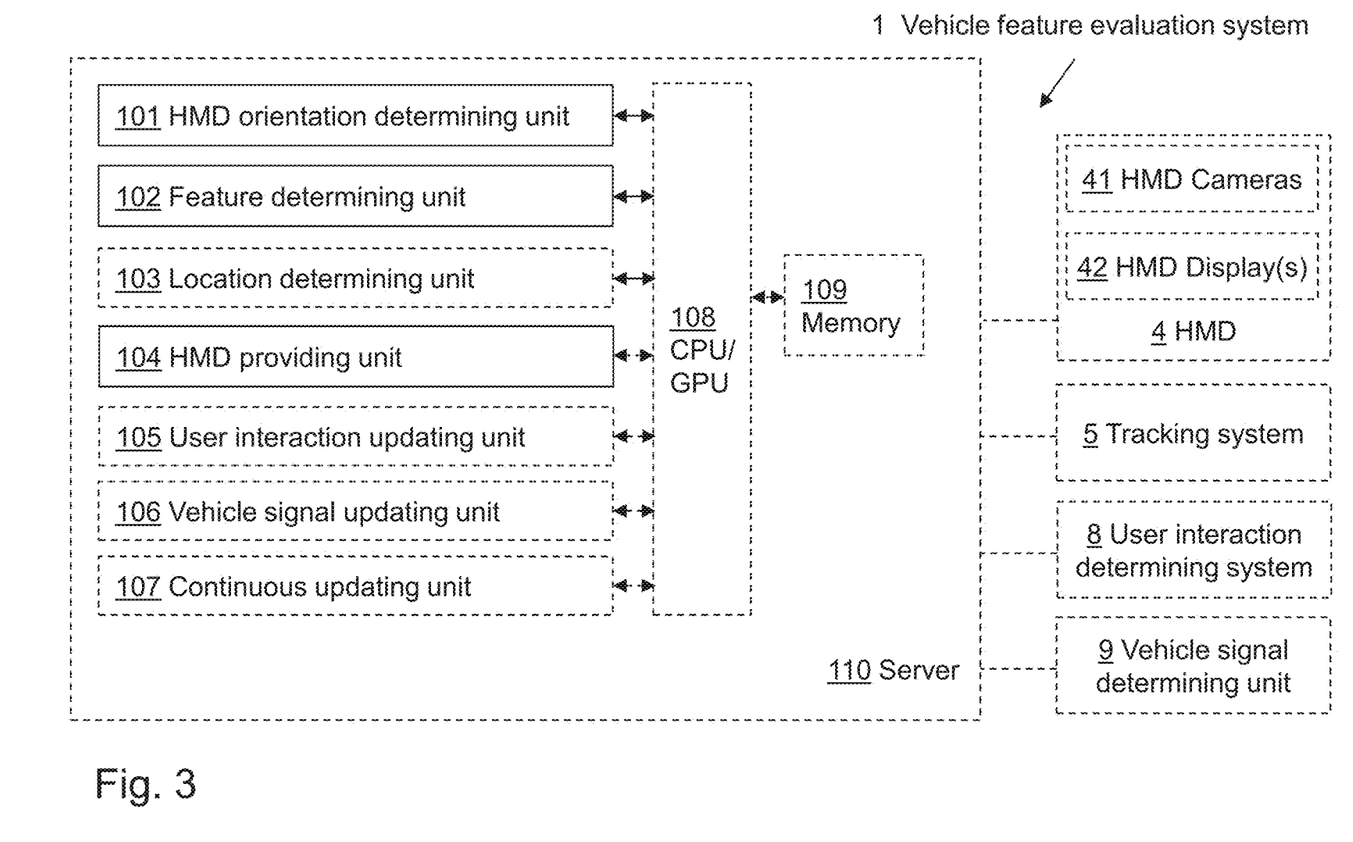
FIG. 3 is a schematic block diagram illustrating an exemplifying vehicle feature evaluation system according to embodiments of the disclosure.
Figure 4:
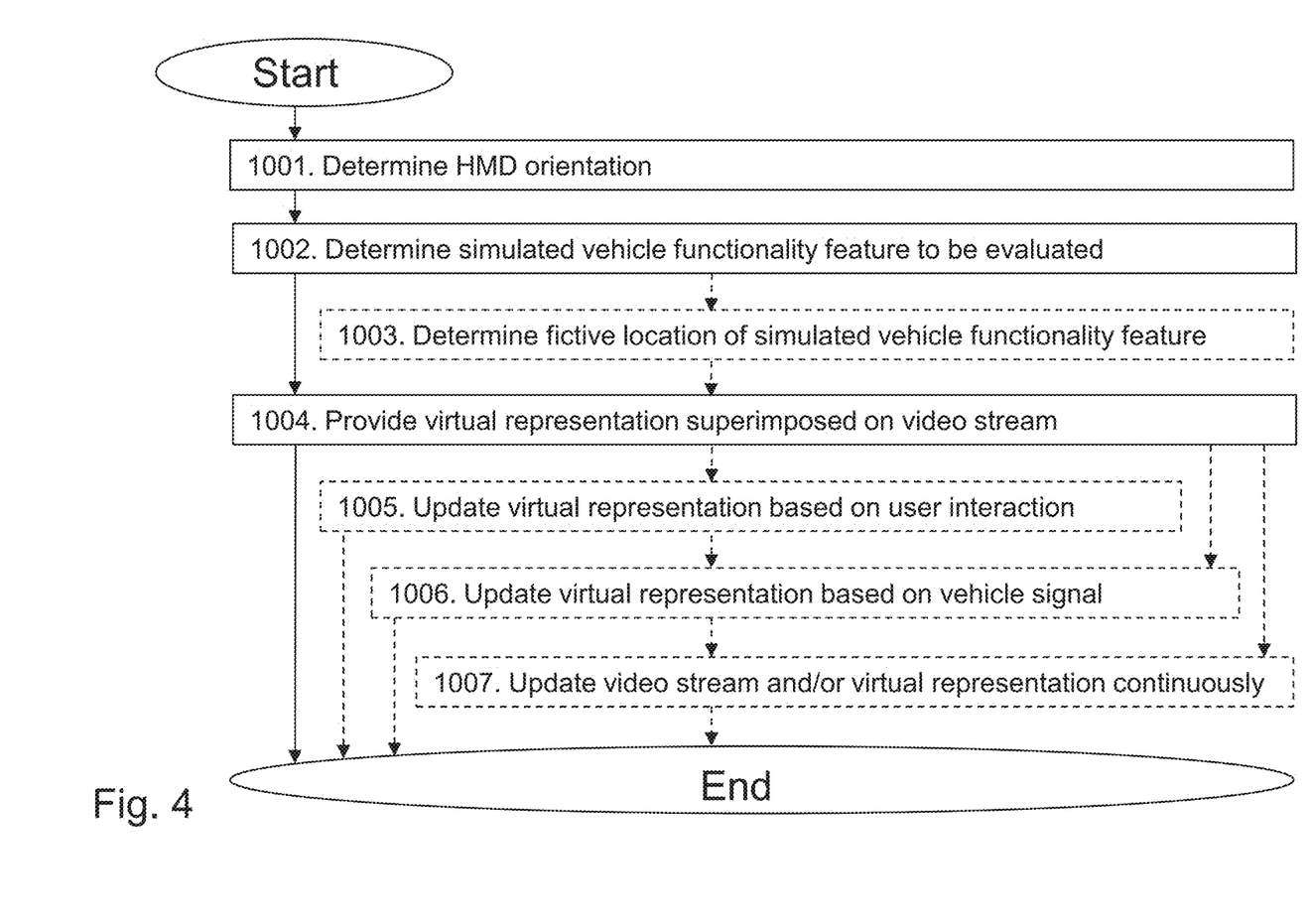
FIG. 4 is a flowchart depicting an exemplifying method performed by a vehicle feature evaluation system according to embodiments of the disclosure.

As further shown in FIG. 3, which is a schematic block diagram illustrating an exemplifying vehicle feature evaluation system 1 according to embodiments of the disclosure, the vehicle feature evaluation system 1 comprises a HMD orientation determining unit 101, a feature determining unit 102, an optional location determining unit 103, a HMD providing unit 104, an optional user interaction updating unit 105, an optional vehicle signal updating unit 106, and an optional continuous updating unit 107, all of which will be described in greater detail in conjunction with FIG. 4. Furthermore, the embodiments herein for enabling evaluation of a simulated vehicle functionality feature, may be implemented through one or more processors, such as a processor 108, here denoted CPU, together with computer program code for performing the functions and actions of the embodiments herein. Said program code may also be provided as a computer program product, for instance in the form of a data carrier carrying computer program code for performing the embodiments herein when being loaded into the vehicle feature evaluation system 1. One such carrier may be in the form of a CD ROM disc and/or a hard drive. It is however feasible with other data carriers such as a memory stick. The computer program code may furthermore be provided as pure program code on a server and downloaded to the vehicle feature evaluation system 1. The vehicle feature evaluation system 1 may further comprise a memory 109 comprising one or more memory units. The memory 109 may be arranged to be used to store e.g. information, and further to store data, configurations, schedulings, and applications, to perform the methods herein when being executed in the vehicle feature evaluation system 1. For instance, the computer program code may be implemented in the firmware, stored in FLASH memory 109, of an embedded processor 108, and/or downloaded from online.

Furthermore, the HMD orientation determining unit 101, the feature determining unit 102, the optional location determining unit 103, the HMD providing unit 104, the optional user interaction updating unit 105, the optional vehicle signal updating unit 106, the optional continuous updating unit 107, the optional processor 108 and/or the optional memory 109, may at least partly be comprised in the server 110, which server 110 may be comprised in and/or carried onboard the road-driven vehicle 2. Those skilled in the art will also appreciate that said units 101, 102, 103, 104, 105, 106, 107 described above, and which will be described in more detail later on in this description, may refer to a combination of analog and digital circuits, and/or one or more processors configured with software and/or firmware, e.g. stored in a memory such as the memory 109, that when executed by the one or more processors such as the processor 108 perform as will be described in more detail in conjunction with FIG. 4. One or more of these processors, as well as the other digital hardware, may be included in a single ASIC (Application-Specific Integrated Circuitry), or several processors and various digital hardware may be distributed among several separate components, whether individually packaged or assembled into a SoC (System-on-a-Chip).

Further shown in FIG. 3 is an exemplifying optional user interaction determining system 8, adapted for determining user interaction by a user e.g. the occupant 3 with the simulated vehicle functionality feature—here the exemplifying simulated vehicle infotainment display. The user interaction determining system 8 may for instance comprise touch sensor(s), camera(s) and/or position detection sensor(s) worn by the user e.g. on his/her hand and/or finger. Also depicted is an exemplifying optional vehicle signal determining unit 9, adapted for determining which input derived from the road-driven vehicle 2 affects the simulated vehicle functionality feature—here the exemplifying simulated vehicle infotainment display—e.g. during manoeuvring of said vehicle 2.

FIG. 4 is a flowchart depicting an exemplifying method performed by a vehicle feature evaluation system 1 according to embodiments of the disclosure. Said method is for enabling evaluation of a simulated vehicle functionality feature. The exemplifying method, which may be continuously repeated, comprises the following actions discussed with support from FIGS. 1-3.

Action 1001

In Action 1001, the vehicle feature evaluation system 1 determines in relation to the road-driven vehicle 2—e.g. by means of the HMD orientation determining unit 101—with support from the tracking system 5, an orientation of the HMD 4 adapted to be worn by the occupant 3 on-board the road-driven vehicle 2. Thus, as shown with support from FIGS. 1-3, there is established a position and/or location of an occupant-worn HMD 4 in view of a real vehicle 2 e.g. adapted to and/or intended to be driven outdoors such as in real traffic and/or along actual roads. Thus, with the HMD-wearing occupant 3 being positioned in a road-driven vehicle 2 rather than in an e.g. indoor static or dynamic rig, evaluation may take place in an actual real vehicle 2.

Action 1002

In Action 1002, the vehicle feature evaluation system 1 determines—e.g. by means of the feature determining unit 102—a simulated vehicle functionality feature to be evaluated in the road-driven vehicle 2. Thus, as shown with support from FIGS. 1-3, there is defined, e.g. computer-generated, a virtual vehicle functionality feature—optionally a simulated vehicle infotainment display—of interest to validate in a real vehicle 2. Thereby, the simulated vehicle functionality feature—here the virtual infotainment display 7—may be evaluated in the road-driven vehicle 2, such as e.g. graphics thereof and/or new and/or updated functionality and/or design thereof.

Optionally, additionally or alternatively, the simulated vehicle functionality feature may comprise a simulated vehicle human machine interface, HMI. Thereby, a virtual vehicle HMI may be evaluated in the road-driven vehicle 2, such as e.g. graphics thereof and/or new and/or updated functionality and/or design thereof. Additionally or alternatively, optionally, the simulated vehicle functionality feature may comprise a simulated vehicle head-up display, HUD. Thereby, a virtual vehicle HUD may be evaluated in the road-driven vehicle 2, such as e.g. graphics thereof and/or new and/or updated functionality and/or design thereof. Additionally or alternatively, optionally, the simulated vehicle functionality feature may comprise a simulated interior vehicle section. Thereby, a virtual interior vehicle section e.g. a dashboard may be evaluated in the road-driven vehicle 2, such as e.g. geometrics for instance CAD and/or DSM geometrics thereof and/or new and/or updated colour(s), material(s) and/or design thereof. Furthermore, additionally or alternatively, optionally, the simulated vehicle functionality feature may comprise simulated light characteristics. Thereby, virtual light characteristics e.g. interior light characteristics may be evaluated in the road-driven vehicle 2, such as e.g. new and/or updated appearance and/or ambience of e.g. interior lighting. Additionally or alternatively, optionally, the simulated vehicle functionality feature may comprise a simulated effect resulting from a simulation of the simulated vehicle functionality feature. Thereby, a virtual effect resulting from simulation of a simulated vehicle functionality feature e.g. wiper performance, cabin climate, air flow, contamination etc. may be evaluated in the road-driven vehicle 2, such as e.g. the effect of a computer-aided engineering, CAE, simulation thereof.

Action 1003

In optional Action 1003, the vehicle feature evaluation system 1 may determine—e.g. by means of the location determining unit 103—a fictive location 70 of the simulated vehicle functionality feature relative the road-driven vehicle 2. Thus, as shown with support from FIGS. 1-3, the fictive location 70 of the simulated vehicle functionality feature—here the simulated infotainment display—may be determined to have a location in relation to the vehicle 2, e.g. in the case of the simulated infotainment display be located for instance essentially centered on the vehicle dashboard.

Action 1004

In Action 1004, the vehicle feature evaluation system 1 provides in real-time to the HMD display 42 of the HMD 4—e.g. by means of the HMD providing unit 104—taking into consideration the HMD orientation, the virtual representation 7 of the simulated vehicle functionality feature superimposed on the real-time real-world video stream 6 derived from real-world image data captured with support from one or more forward-facing cameras 41 provided on the HMD 4 in eye-position of the occupant 3. Thus, as shown with support from FIGS. 1-3, there is provided to the HMD display 42 a real-time physical world view 6—essentially as seen by the occupant 3 with support from the eye-level forward facing camera(s) 41—electronically mixed with the computer-generated virtual feature 7 temporally and spatially commensurate with said physical world view 6 such that the real-world video stream 6 appears as a background overlaid with said virtual feature 7. Thus, live imagery from the physical world is electronically merged with computer-generated imagery, a concept commonly referred to as mixed reality and/or augmented reality. More specifically, the virtual representation 7 of the simulated vehicle functionality feature is overlaid the real-world video stream 6, a concept commonly referred to as video see-through. Thus, with the forward-facing camera(s) 41 provided in eye-position of the HMD-wearing occupant 3, the real-time real-world video stream 6 may represent what the occupant 3 would see even if not wearing the HMD 4, such as temporally and spatially commensurate with what said occupant 3 would see even if not wearing the HMD 4. Subsequently, with the HMD-wearing occupant 3 being on-board the road-driven vehicle 2, e.g. seated in a driver's seat or passenger's seat thereof, the real-time real-world video stream 6 may then represent what a driver or passenger of said road-driven vehicle 2 would see even if not wearing the HMD 4, such as for instance a portion of an interior of the road-driven vehicle 2 and/or a view exterior of the road-driven vehicle 2 through the windscreen or other window(s) thereof. Accordingly, upon in real-time superimposing a virtual representation 7 of a simulated vehicle functionality feature—in FIGS. 1-2 the exemplifying virtual infotainment display showing a new and/or updated design and/or functionality—on the real-world video stream 6, said simulated vehicle functionality feature—here the exemplifying simulated infotainment display—may be evaluated in a road-driven vehicle 2, e.g. while said road-driven vehicle 2 is driven in real traffic and/or along actual roads. Thereby, with the exception of the virtual representation 7 of the simulated vehicle functionality feature e.g. the simulated infotainment display, the entire test environment is authentic and/or real. Consequently, the simulated vehicle functionality feature may be evaluated in real traffic and/or in real road-driving scenarios, which thus enables said simulated vehicle functionality feature e.g. the simulated infotainment display to be evaluated under more reality-resembling conditions and/or in a more reality-resembling environment than should said evaluation be performed in e.g. a commonly known static or dynamic rig displaying the environment and traffic on large scale screens in front of a vehicle mock-up.

Optionally, should Action 1004 of providing discussed above be preceded by optional Action 1003 of determining a fictive location 70 of the simulated vehicle functionality feature relative the road-driven vehicle 2, then Action 1004 of providing taking into consideration the HMD orientation may comprise providing the virtual representation 7 superimposed on the real-time real-world video stream 6 such that positioning of the virtual representation 7 corresponds to the fictive location 70. Thus, as shown with support from FIGS. 1-3, it is provided that the positioning of the overlaid virtual representation 7—in FIGS. 1-2 the virtual infotainment display—on the real-world video stream 6, spatially commensurate with the intended fictive vehicle location 70 of the vehicle functionality feature to be simulated, hence in FIGS. 1-2 with the exemplifying centre of the vehicle dashboard.

Action 1005

In optional Action 1005, the vehicle feature evaluation system 1 may update—e.g. by means of the user interaction updating unit 105—the virtual representation 7 based on a user interaction with the simulated vehicle functionality feature. Thereby, interaction by a user with the simulated vehicle functionality feature may result in that the virtual representation 7 of the simulated vehicle functionality feature is updated in accordance with said interaction. Thus, as shown with support from FIGS. 1-3, user interaction with the simulated vehicle functionality feature—in FIGS. 1-2 represented by selectable options available on the simulated vehicle display—may result in that a user selected option is carried out and/or updated in accordance with the user interaction, which subsequently is reflected by the corresponding virtual feature 7—here the virtual infotainment display 7—being updated in accordance therewith.

Optionally, said user interaction may be based on detection, by means of one or more user interaction sensors, of a user in and/or at the fictive location 70. Thus, as shown with support from FIGS. 1-3, presence of a user, e.g. the HMD-wearing occupant 3, and/or e.g. a finger of said user/occupant 3, may be sensed in or at the position in the vehicle 2 representing the location of the simulated vehicle functionality feature, in FIGS. 1-2 in or at essentially the centre of the vehicle dashboard, whereby the virtual representation 7 of the simulated vehicle functionality feature, here the simulated infotainment display, subsequently may be updated in accordance with said presence, and/or in accordance with the geographical position and/or the nature of said presence. User interaction may be detected in any arbitrary manner known in the art, e.g. by means of one or more user interaction sensors and/or the user interaction determining system 8 shown in FIG. 3, for instance comprising touch sensor(s), camera(s) and/or position detection sensor(s) worn by the user e.g. on his/her hand and/or finger.

Action 1006

In optional Action 1006, the vehicle feature evaluation system 1 may update—e.g. by means of the vehicle signal updating unit 106—the virtual representation 7' based on a vehicle signal affecting the simulated vehicle functionality feature, derived from the road-driven vehicle 2. Thus, as shown with support from at least FIGS. 2-3, deriving a vehicle signal which affects the simulated vehicle functionality feature—e.g. resulting from manoeuvring of and/or user interaction with the road-driven vehicle 2—may result in that the virtual representation 7' of the simulated vehicle functionality feature, in FIG. 2 the virtual information display 7', is updated in accordance therewith. That is, deriving—from the road-driven vehicle 2—a vehicle signal affecting the simulated vehicle functionality feature, where the vehicle signal for instance comprises vehicle data such as e.g. fuel consumption and where the simulated vehicle display shows said vehicle data e.g. fuel consumption, may result in that the virtual feature 7'—in FIG. 2 the exemplifying virtual information display 7'—is updated in accordance with said vehicle signal, i.e. the fuel consumption value shown on the virtual information display 7' is updated along with the received updated fuel consumption value. The vehicle signal may be derived from the road-driven vehicle 2 in any arbitrary known manner, for instance via wired and/or wireless communication therewith, and/or with support from the vehicle signal determining system and/or unit 9 adapted for determining which input derived from the road-driven vehicle 2 affects the simulated vehicle functionality feature.

Action 1007

In optional Action 1007, the vehicle feature evaluation system 1 may update—e.g. by means of the continuous updating unit 107—the real-time video stream 6 and/or the superimposed virtual representation 7 based on updated captured image data and/or based on updated determined HMD orientation. Thus, as shown with support from FIGS. 1-3, it is provided that the real-time video stream 6 and/or the virtual representation 7 is continuously updated to reflect updated captured image data and/or updated orientation of the HMD.

The person skilled in the art realizes that the present disclosure by no means is limited to the preferred embodiments described above. On the contrary, many modifications and variations are possible within the scope of the appended claims. It should furthermore be noted that the drawings not necessarily are to scale and the dimensions of certain features may have been exaggerated for the sake of clarity. Emphasis is instead placed upon illustrating the principle of the embodiments herein. Additionally, in the claims, the word "comprising" does not exclude other elements or steps, and the indefinite article "a" or "an" does not exclude a plurality.

The invention claimed is:

1. A method performed by a vehicle feature evaluation system for enabling evaluation of a simulated vehicle functionality feature, the method comprising:
determining in relation to a road-driven vehicle, with support from a tracking system, an orientation of a head-mounted display, HMD, adapted to be worn by an occupant on-board the road-driven vehicle;
determining a simulated vehicle functionality feature to be evaluated in the road-driven vehicle;
providing in real-time to a HMD display of the HMD, taking into consideration the HMD orientation, a virtual representation of the simulated vehicle functionality feature superimposed on a real-time real-world video stream derived from real-world image data captured with support from one or more forward-facing cameras provided on the HMD in eye-position of the occupant; and
updating the virtual representation based on a vehicle signal affecting the simulated vehicle functionality feature, derived from the road-driven vehicle, wherein the simulated vehicle functionality feature comprises a simulated effect resulting from a simulation of the simulated vehicle functionality feature.

2. The method according to claim 1, wherein the simulated vehicle functionality feature comprises:
a simulated vehicle human machine interface, HMI;
a simulated vehicle display;
a simulated vehicle head-up display, HUD;
a simulated interior vehicle section; and/or
simulated light characteristics.

3. The method according to claim 1, further comprising:
determining a fictive location of the simulated vehicle functionality feature relative the road-driven vehicle;
wherein the providing taking into consideration the HMD orientation comprises providing the virtual representation superimposed on the real-time real-world video stream such that positioning of the virtual representation corresponds to the fictive location.

4. The method according to claim 1, further comprising:
updating the virtual representation based on a user interaction with the simulated vehicle functionality feature.

5. The method according to claim 4, wherein the user interaction is based on detection, by means of one or more user interaction sensors, of a user in and/or at a fictive location.

6. The method according to claim 1, further comprising:
updating the real-time video stream and/or the superimposed virtual representation based on updated captured image data and/or based on updated determined HMD orientation.

7. A vehicle feature evaluation system for enabling evaluation of a simulated vehicle functionality feature, the vehicle feature evaluation system comprising:
a memory storing instructions executed by a processor for providing:
a HMD orientation determining unit for determining in relation to a road-driven vehicle, with support from a tracking system, an orientation of a head-mounted display, HMD, adapted to be worn by an occupant on-board the road-driven vehicle;
a feature determining unit for determining a simulated vehicle functionality feature to be evaluated in the road-driven vehicle;
a HMD providing unit for providing in real-time to a HMD display of the HMD, taking into consideration the HMD orientation, a virtual representation of the simulated vehicle functionality feature superimposed on a real-time real-world video stream derived from real-world image data captured with support from one or more forward-facing cameras provided on the HMD in eye-position of the occupant;
a vehicle signal updating unit for updating the virtual representation based on a vehicle signal affecting the simulated vehicle functionality feature, derived from the road-driven vehicle, wherein the simulated vehicle functionality feature comprises a simulated effect resulting from a simulation of the simulated vehicle functionality feature.

8. The vehicle feature evaluation system according to claim 7, wherein the simulated vehicle functionality feature comprises:
- a simulated vehicle human machine interface, HMI;
- a simulated vehicle display;
- a simulated vehicle head-up display, HUD;
- a simulated interior vehicle section; and/or
- simulated light characteristics.

9. The vehicle feature evaluation system according to claim 7, further comprising:
- the memory storing instructions executed by the processor for providing:
  - a location determining unit for determining a fictive location of the simulated vehicle functionality feature relative the road-driven vehicle;
  - wherein the HMD providing unit further is adapted for providing the virtual representation superimposed on the real-time real-world video stream such that positioning of the virtual representation corresponds to the fictive location.

10. The vehicle feature evaluation system according to claim 7, further comprising:
- the memory storing instructions executed by the processor for providing:
  - a user interaction updating unit for updating the virtual representation based on a user interaction with the simulated vehicle functionality feature.

11. The vehicle feature evaluation system according to claim 10, wherein the user interaction is based on detection, by means of one or more user interaction sensors, of a user in and/or at the fictive location.

12. The vehicle feature evaluation system according to claim 7, further comprising:
- the memory storing instructions executed by the processor for providing:
  - a continuous updating unit for updating the real-time video stream and/or the superimposed virtual representation based on updated captured image data and/or based on updated determined HMD orientation.

13. A vehicle comprising a vehicle feature evaluation system according to claim 7.

* * * * *